(12) United States Patent
Ewanchuk et al.

(10) Patent No.: US 11,251,151 B2
(45) Date of Patent: Feb. 15, 2022

(54) SYSTEM AND METHOD FOR ALLOWING RESTORATION OF INTERCONNECTION OF DIE OF POWER MODULE

(71) Applicant: MITSUBISHI ELECTRIC CORPORATION, Tokyo (JP)

(72) Inventors: Jeffrey Ewanchuk, Rennes (FR); Julio Brandelero, Rennes (FR); Stefan Mollov, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/755,845

(22) PCT Filed: Oct. 31, 2018

(86) PCT No.: PCT/JP2018/041257
§ 371 (c)(1),
(2) Date: Apr. 13, 2020

(87) PCT Pub. No.: WO2019/107094
PCT Pub. Date: Jun. 6, 2019

(65) Prior Publication Data
US 2020/0286848 A1 Sep. 10, 2020

(30) Foreign Application Priority Data
Nov. 28, 2017 (EP) .................... 17204197

(51) Int. Cl.
H01L 23/00 (2006.01)
H01L 23/34 (2006.01)
H01L 23/58 (2006.01)

(52) U.S. Cl.
CPC ............ H01L 24/32 (2013.01); H01L 23/345 (2013.01); H01L 23/58 (2013.01); H01L 24/29 (2013.01);
(Continued)

(58) Field of Classification Search
CPC .................... H01L 24/32; H01L 24/29; H01L 2224/83801; H01L 2224/29111;
(Continued)

(56) References Cited

U.S. PATENT DOCUMENTS

2015/0333757 A1  11/2015  Aiko et al.
2016/0233202 A1   8/2016  Komo et al.
2019/0116224 A1*  4/2019  Yu .......................... H04L 9/0897

FOREIGN PATENT DOCUMENTS

JP  2006-73810 A   3/2006
JP  2014-160804 A  9/2014
(Continued)

OTHER PUBLICATIONS

International Search Report for PCT/JP2018/041257 (PCT/ISA/210) dated Jan. 30, 2019.
(Continued)

Primary Examiner — Jasmine J Clark
(74) Attorney, Agent, or Firm — Birch, Stewart, Kolasch & Birch, LLP

(57) ABSTRACT

The present invention concerns a system for allowing the restoration of an interconnection of a die of a power module, a first terminal of the interconnection being fixed on the die and a second terminal of the interconnection being connected to an electric circuit. The system comprises:—at least one material located in the vicinity of the first terminal of the interconnection, the material having a predetermined melting temperature,—means for controlling the temperature of the die at the predetermined melting temperature during a predetermined period of time. The present invention concerns also the method.

13 Claims, 6 Drawing Sheets

(52) U.S. Cl.
CPC ..... *H01L 24/83* (2013.01); *H01L 2224/29111* (2013.01); *H01L 2224/29113* (2013.01); *H01L 2224/29116* (2013.01); *H01L 2224/32225* (2013.01); *H01L 2224/83801* (2013.01); *H01L 2924/20105* (2013.01)

(58) Field of Classification Search
CPC . H01L 2224/32225; H01L 2224/29113; H01L 2224/29116; H01L 2924/20105; H01L 23/345; H01L 23/58; H01L 24/83
See application file for complete search history.

(56) References Cited

FOREIGN PATENT DOCUMENTS

| WO | WO 2014/103036 A1 | 3/2014 |
|---|---|---|
| WO | WO 2015/083250 A1 | 11/2015 |

OTHER PUBLICATIONS

Written Opinion of the International Searching Authority for PCT/JP2018/041257 (PCT/ISA/237) dated Jan. 30, 2019.
Office Action dated Feb. 2, 2021 issued in counterpart Japanese Application No. 2020-502723 with English Translation.

\* cited by examiner

SYSTEM AND METHOD FOR ALLOWING RESTORATION OF INTERCONNECTION OF DIE OF POWER MODULE

TECHNICAL FIELD

The present invention relates generally to a method and a system for allowing the restoration of an interconnection of a die of a power module.

BACKGROUND ART

Power modules installed in applications experience wear out due to the fact that they are composed of a variety of layered materials, each with different properties.

Power modules have to support large temperature excursions during operation. The wear out inherent to the operation manifests as an increasing crack in various interface layers such as the solder layer or the wire bonds.

In order to combat wear out, power modules are designed with better matched materials, but this solution often suffers from poor electrical performance and higher manufacturing costs. Furthermore, due to these additional manufacturing costs, it is not practical to design a power module to accommodate the most severe usage scenarios, leading to more stressful applications having lower power module lifetimes.

SUMMARY OF INVENTION

The present invention aims to allow the restoration of at least one interconnection of a die of a power module.

To that end, the present invention concerns a system for allowing the restoration of an interconnection of a die of a power module, a first terminal of the interconnection being fixed on the die and a second terminal of the interconnection being connected to an electric circuit, characterized in that the system comprises:
  at least one material located in the vicinity of the first terminal of the interconnection, the material having a predetermined melting temperature,
  means for controlling the temperature of the die at the predetermined melting temperature during a predetermined period of time.

The present invention concerns also a method for allowing the restoration of an interconnection of a die of a power module, a first terminal of the interconnection being fixed on the die and a second terminal of the interconnection being connected to an electric circuit, characterized in that at least one material is located in the vicinity of the first terminal of the interconnection, the material having a predetermined melting temperature and the method comprises the step of controlling the temperature of the die at the predetermined melting temperature during a predetermined period of time.

Thus, the interconnection of a die of a power module may be restored by a control signal of the die like for example a control signal to the gate, thereby lowing the cost of the solution. The restoration state can be induced in-situ, thereby reducing the time lost to maintenance, a restoration process can be reliably induced in a power module, thereby allowing the power module to fulfill its mission for a significantly longer duration.

According to a particular feature, the die and the at least one material located in the vicinity of the first terminal are recovered by a solid material.

Thus, the material located in the vicinity of the first terminal does not interact during the normal operation of the power module.

According to a particular feature, the material located in the vicinity of the first terminal is tin and lead-bismuth alloy.

Thus, the tin and lead-bismuth alloy is solid during the normal operation of the die and the temperature to induce the liquid phase is inferior to the maximum safe working junction temperature of the die. Thus, the heat may be generated only by the die itself without damage to the die and without an external heat source.

According to a particular feature, the melting temperature is equal to 150° C. and the predetermined period of time is 30 mn.

Thus, the melting temperature is in the safe working region of the die and may be achieved using the heat generated only by the die itself without an external heat source during a maintenance interval.

According to a particular feature, the means for controlling the temperature of the die to obtain the temperature of the die is from a thermocouple.

Thus, the temperature can be controlled using low cost and widely available sensors.

According to a particular feature, the means for controlling the temperature of the die obtain the temperature of the die from a temperature sensitive electrical parameter of the die.

Thus, the temperature of the die and then the temperature of the interconnection may be controlled without any extra thermo sensor, reducing the number of components necessary for the proposed implementation.

According to a particular feature, the temperature sensitive electrical parameter of the die is the gate-emitter voltage value of the die.

Thus, no modification in the interconnection of the die or in the gate control and the gate-emitter voltage value is directly derived from the means for controlling the temperature.

The characteristics of the invention will emerge more clearly from a reading of the following description of example embodiments, the said description being produced with reference to the accompanying drawings.

DESCRIPTION OF EMBODIMENTS

Figure 1:
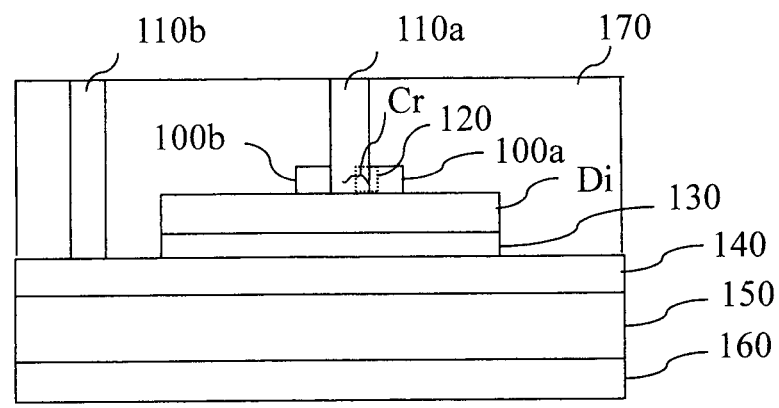
FIG. 1 represents an example of a power module in which the present invention is implemented.

FIG. 1 represents an example of a power module in which the present invention is implemented.

The power module comprises interconnections 110a and 110b, like for example copper layers, that connect a die Di to external components.

The die Di is fixed on a cooper layer 140 of a direct copper bonding (DCB) substrate 140, 150, 160 using a solder 130, the ceramic 150 is fixed on a copper base plate 160 that is fixed on a cold plate.

According to the present invention, the power module further comprises at least for one interconnection, healing agents 100a and 100h, like for example, tin and lead-bismuth alloys, which have a low melting temperature that turns liquid at a given temperature.

Figure 2A:
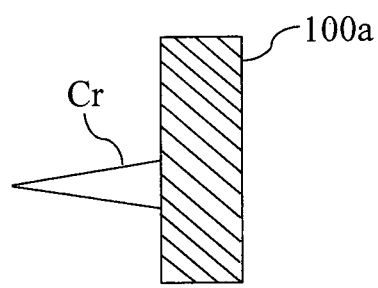
FIG. 2a represents an enlarged view of a region of an interconnection that comprises a crack that can be repaired according to the present invention.
Figure 2B:
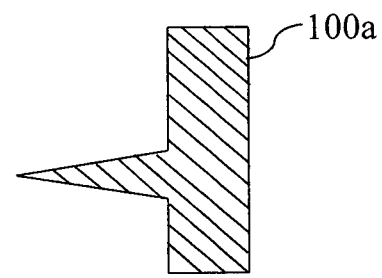
FIG. 2b represents an enlarged view of a region of an interconnection that comprises a crack that can be repaired according to the present invention.

The healing agent surrounds the interconnection and may penetrate in a crack 120 that exists in the interconnection 110a as shown in FIGS. 2a and 2b.

A solid material 170, like for example an epoxy or a silicon-based encapsulation gel, recovers the die, the healing agents 100 and the DCB.

FIGS. 2a and 2b represent an enlarged view of a region of an interconnection that comprises a crack that can be repaired according to the present invention.

The FIG. 2a represents a region noted 120 in FIG. 1 of the power module that comprises the crack Cr and the healing agent 100a that permeates into the crack Cr by capillary motion at the interconnection 110a as shown in FIG. 2b. The permeation is further facilitated by the cyclical applications of thermal stress with ensuing deformation. A variation would have to be the alloy specifically selected for its electromigration properties, such as Al-4Cu, whereby the edge of the crack is repaired by metal transport facilitated by the high current during normal commutation and high temperature maintained according to the present invention.

Furthermore, it is also possible that the interconnection within the power module itself is made of a self-healing material, like for example shape memory alloy, where just the high temperature is required to activate the healing process.

Figure 3:
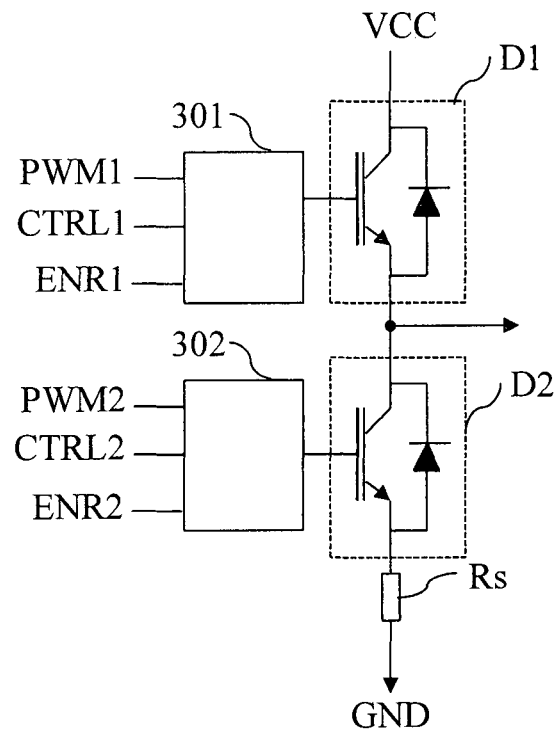
FIG. 3 represents a system comprising a power module and drivers according to the present invention.

FIG. 3 represents a system comprising a power module and drivers according to the present invention.

According to the invention, an high loss state is generated within at least one die Di of the power module by applying a voltage to the gate of the die.

For a voltage driven semiconductor die i.e. an IGBT or a MOSFET, the leakage current of the die makes the die an imperfect isolator while blocking voltage. If the die is blocking a voltage, the power dissipated in the die is related to the leakage current and the blocking voltage. In such a case, the die is in the high loss state.

The high loss state is due to a controlled gate voltage and current feedback control loop, which enables the leakage current in the voltage driven die to be controlled, and thereby the active heat in the die is controlled as well.

The present invention controls the heating state while the power module is operating, in order to activate a restoration state in the power module.

In a half bridge configuration, when one die is in the ON state, the second die is in the OFF states and blocks a voltage. Hence, in the OFF state, when a die is blocking a voltage, the power dissipated is directly impacted by the leakage current or the current flowing from collector to emitter in the case of an IGBT. The gate voltage is adjusted just past the threshold voltage to induce a small current in the channel, whereby the die is controlled in a linear mode:

$$I_c = k^*(V_{gs} - V_{Th})^2$$

where k is related to the transconductance of the die, $V_{gs}$, is the applied gate voltage, $I_c$ is the collector current and $V_{Th}$ is the threshold voltage of the die.

By linearizing above equation around a DC gate voltage $V_{gs}$ closed to the threshold voltage with the corresponding collector current, we obtain:

$$\frac{\partial I_c}{\partial V_{gs}} = 2 \cdot k \cdot (V_{gs} - V_{Th})$$

that represents the small signal transfer function from the small signal gate voltage $\partial V_{gs}$ to the corresponding change in collector current, $\partial I_c$.

Hence, assuming that the power module has a temperature dependant restoration state, by controlling the gate voltage around the DC operating point, $V_{gs}$, the heat generated in the power module is controlled, enabling the power module to reach the desired temperature. With a given amount of power generated in the power module, the case temperature rises until the power is removed. Hence, as the power module requires a specific temperature over a minimum time in order to activate the restoration process, e.g. 150° C. for 30 minutes, the control of the collector current in the power module during the off-state of the die can allow for the healing of cracks induced by thermo-mechanical fatigue.

In the example of FIG. 3, the power module is composed of two dies D1 and D2 that are driven respectively by the gate voltage controllers 301 and 302.

The gate voltage controller 301 receives a signal PWM1 and provides it to the die D1. The PWM1 signal is the signal to be applied to the die D1 during normal operation. The gate voltage controller 301 receives an enable restoration signal ENR1 that enables the restoration process. For example, the enable restoration signal ENR1 enables the restoration process periodically, for example each year during a given time, for example 30 mn.

The gate voltage controller 301 receives a control signal CTRL1.

The gate voltage controller 302 receives a signal PWM2 and provides it to the die D2. The PWM2 signal is the signal to be applied to the die D2 during normal operation. The gate voltage controller 302 receives an enable restoration signal ENR2 that is enables the restoration process. For example, the enable restoration signal ENR2 enables the restoration process periodically, for example each year during a given time, for example 30 mn.

The gate voltage controller 302 receives a control signal CTRL2.

A shunt resistor Rs is used to monitor the collector current.

Figure 4:
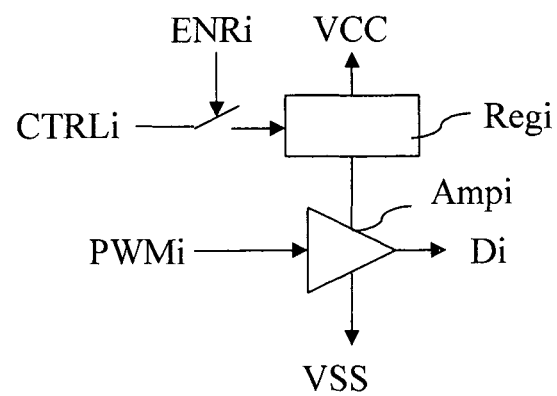
FIG. 4 represents an example of an architecture of a gate voltage controller that is used for implementing the present invention.

FIG. 4 represents an example of an architecture of a gate voltage controller that is used for implementing the present invention.

The gate voltage controller comprises an amplifier Ampi that amplifies the signal PWMi with i=1 or 2.

The amplifier Ampi is power supplied by a negative power supply VSS and a positive power supply VCC through a regulator Regi.

The signal CTRLi is applied to the regulator Regi when the enable restoration signal ENRi is active.

Figure 5:
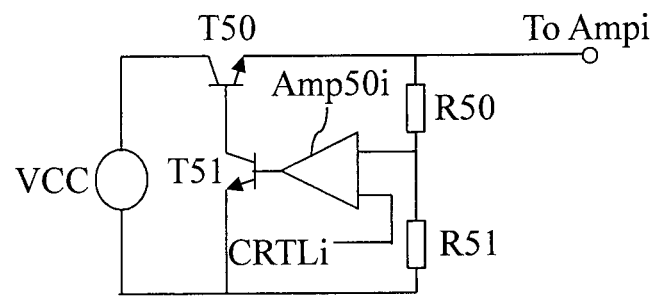
FIG. 5 represents a voltage regulator that is used according to the present invention.

FIG. 5 represents a voltage regulator that is used according to the present invention.

A controllable dc regulator is used to adjust the applied gate voltage.

Figure 6:
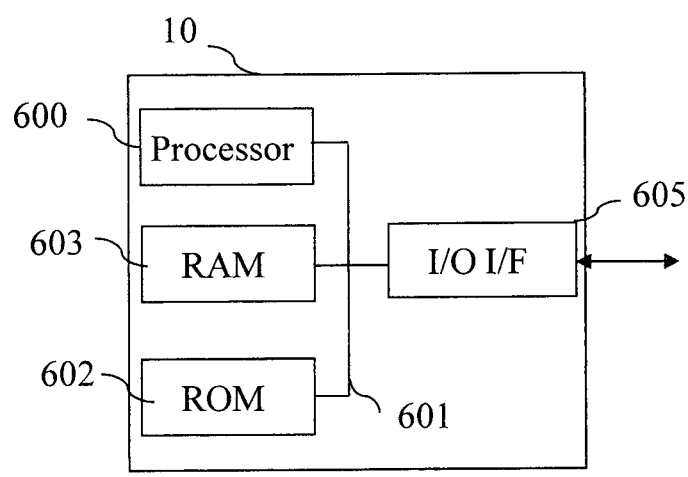
FIG. 6 represents an example of an architecture of a controller according to the present invention.

In order to process the feedback information and provide a reference for the controllable voltage regulator, a controller is used, as shown in FIG. 6. A measured collector current, e.g. by the shunt resistor Rs, is used as a reference to modulate the applied gate voltage, such as to control the power dissipation in the power module to a specific level to induce the healing state. Depending on the properties of the restoration material in the power module, the temperature might be required to be held constant, in which case, a thermocouple embedded onto the power module can be employed for regulation purposes or a thermal sensitive electrical parameter can be employed (e.g. Vg for a certain current Ic).

The voltage regulator Regi is composed of one amplifier Amp50$i$, two resistors R50 and R51 and two transistors T50 and T51. The negative input of the amplifier Amp50$i$ is connected to a first terminal of the resistor R50 and to a first terminal of the resitor R51. The second terminal of the resitor R50 is connected to the emitter of the transistor T50 and to the amplifier Amp$i$ of FIG. 4. The second terminal of the resitor R51 is connected to the emitter of the transistor T51 and to the reference of the power supply VCC.

The positive terminal of the power supply VCC is connected to the collector of the transistor T50.

The output of the amplifier Amp50$i$ is connected to the base of the transistor T51 and the collector of the transistor T51 is connected to the base of the transistor T50.

FIG. 6 represents an example of an architecture of a controller according to the present invention.

Figure 7:
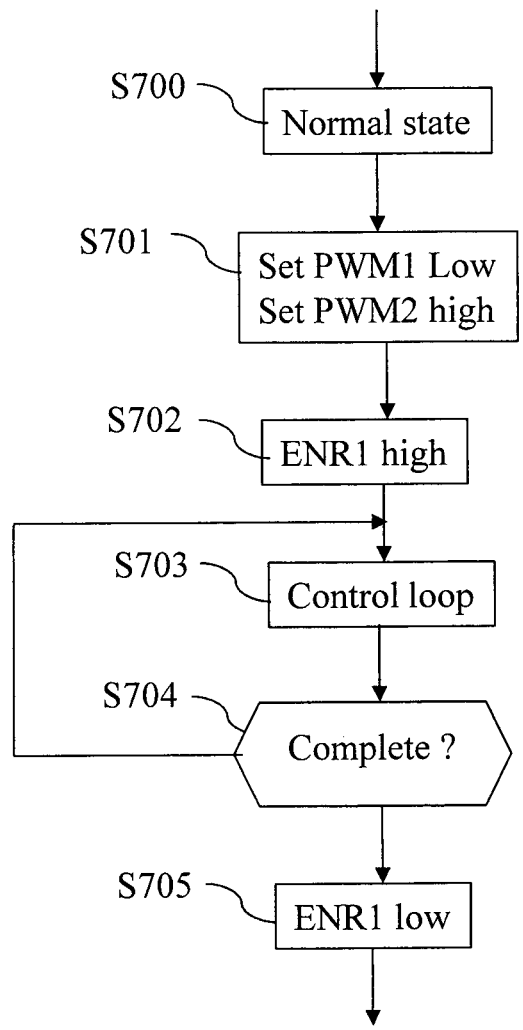
FIG. 7 represents an algorithm for controlling the heating state of a solder layer in order to realize healing process according to the invention.

The controller 10 has for example, an architecture based on components connected together by a bus 601 and a processor 600 controlled by a program as disclosed in FIG. 7.

The bus 601 links the processor 600 to a read only memory ROM 602, a random access memory RAM 603 and an input output interface I/O IF 605.

The memory 603 contains registers intended to receive variables and the instructions of the program related to the algorithm as disclosed in FIG. 7.

The processor 600 receives through the input output I/O IF 605 the collector current Ic, the temperature sensed by a temperature sensor or a thermal sensitive parameter feedback, like the gate to emitter voltage value Vge, and provides the signal PWM1, PMW2, ENR1, ENR2, CTRL1 and CTRL2.

A measured collector current, e.g. by the shunt resistor Rs, is used as a reference to modulate the applied gate voltage, such as to control the power dissipation in the power module to a specific level to induce the healing state. Depending on the properties of the restoration material in the power module, the temperature might be required to be held constant, in which case, a thermocouple embedded onto the power module can be employed for regulation purposes or a thermal sensitive electrical parameter based method can be employed (eg. Vg for a certain current Ic).

The read-only memory, or possibly a Flash memory 602, contains instructions of the program related to the algorithm as disclosed in FIG. 7, when the controller 10 is powered on, to the random access memory 603.

The controller 10 may be implemented in software by execution of a set of instructions or programmed by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the controller 10 includes circuitry, or a device including circuitry, enabling the controller 10 to perform the program related to the algorithm as disclosed in FIG. 7.

FIG. 7 represents an algorithm for controlling the heating state of a solder layer in order to realize healing process according to the invention.

The present algorithm is disclosed in an example where it is executed by the processor 600 of the controller 10.

At step S700, the enable restauration signals ENR1 and ENR2 at the low logical level i.e. the restoration process is disabled.

At next step S701, the processor 600 sets the signal PWM1 to low level and the signal PWM2 at high level.

At next step S702, the processor 600 sets the enable restauration signal ENR1 to high level i.e. the restoration process starts for the die D1.

Figure 8:
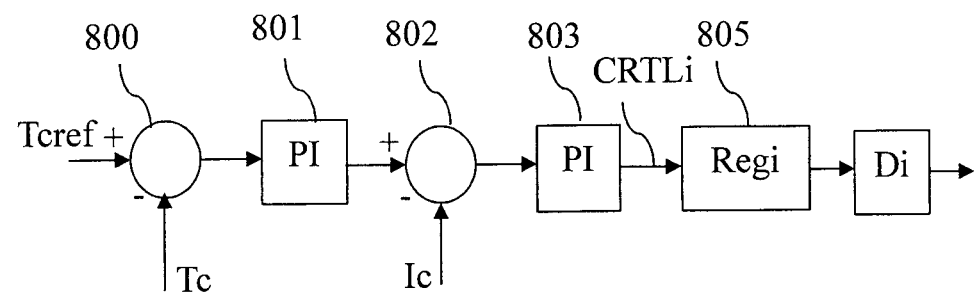
FIG. 8 is an example of a control loop that uses a temperature thermocouple feedback.
Figure 9:
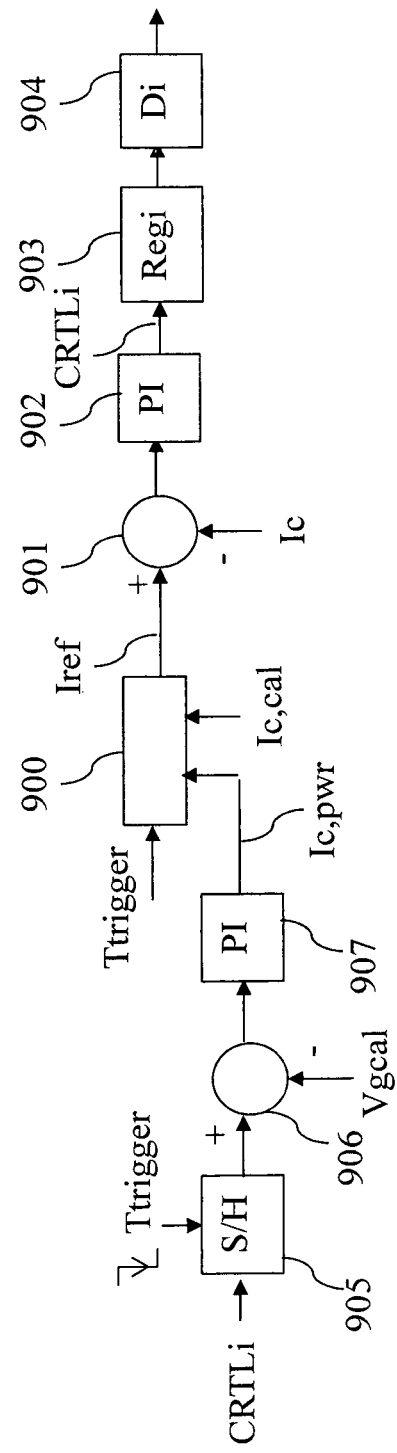
FIG. 9 is an example of a control loop that uses a temperature sensitive electrical parameter feedback.

At step S703, the processor 600 controls the heating state control loop that will be disclosed in reference to FIG. 8 or 9.

Two implementations of the control loop for regulation of the collector current are possible, considering the use of a temperature feedback parameter. For a first approach, a thermocouple is used to provide the case temperature, the control is depicted in FIG. 8. For a second approach, the gate to emitter voltage is used as a thermal sensitive electrical parameter to measure the temperature, the control is depicted in FIG. 9.

The temperature is regulated during a given duration, for example 150° C. during 30 mn.

At step S704, the processor 600 checks if the given duration is completed. If the given duration is completed, the processor 600 moves to step S705. Otherwise, the processor 600 returns to step S703.

At step S705, the processor 600 sets the enable restauration signal ENR1 to low level i.e. the restoration process is interrupted for the die D1.

After that, the processor 600 executes the present algorithm for the die D2.

FIG. 8 is an example of a control loop that uses a thermocouple temperature feedback.

The module 800 substracts the temperature sensed by the temperature sensor to a reference temperature Tcref that corresponds to the melting temperature of the healing agents 100.

The module 801 is a proportional integrator that transforms the temperature error $\partial T$ provided by the module 800 in a reference current $I_{c,ref}$ and can be defined by a proportional ($K_{p1}$) and integral ($K_{i1}$) relationship assuming the integral value is some gain, C, based on the sampling frequency and the magnitude of desired error compensation:

$$Tc = R_{th} * P, \; P = I_c * V_{ce} \therefore \partial T =$$

$$R_{th} * V_{ce} * \partial I_c \rightarrow I_{c,ref} = \Delta T * \left(\frac{1}{R_{th} * V_{ce}}\right) + \left(\frac{C}{R_{th} * V_{ce}}\right) \int \Delta T dt \rightarrow I_{c,ref} =$$

$$\Delta T * K_{p1} + K_{i1} \int \Delta T dt$$

where $V_{ce}$ is the collector to emitter voltage, and $I_c$ is the collector current, $R_{th}$ is the thermal resistance of the power module, and P is the power dissipation.

The measured collector current $I_c$ is subtracted to the reference current $I_{c,ref}$ by the subtractor 802 in order to obtain a difference current $\partial I_c$. The module 803 is a proportional integrator that transforms the difference current $\partial I_c$ provided by the module 802 in the gate bias voltage CRTLi that can be defined by a proportional ($K_{p2}$) and integral ($K_{i2}$) relationship, assuming that we are operating at the DC gate bias voltage, $V_{bias}$, which is slightly higher than the datasheet threshold voltage. Again, we need to assume some gain C' exists based on the sampling frequency, K' is some constant defined by the physical properties of the semiconductor type, and the magnitude of the desired error compensation.

$$\partial I_c = 2 * K' * (Vgref - V_{th}) \partial V_g \rightarrow V_{g,ref} =$$
$$\left(\frac{1}{2*K'*(Vout-V_{th})}\right)*\Delta I_c + \left(\frac{C}{2*K'*(-V_{th})}\right)*\int \Delta I_c dt \rightarrow V_{g,ref} =$$
$$K_{p2}*\Delta I_c + K_{i2}*\int \Delta I_c dt$$

The signal CTRLi is provided to the voltage regulator Regi that provides the gate to emiter voltage Vge to the die.

FIG. 9 is an example of a control loop that uses a temperature sensitive electrical parameter.

The thermal sensitive electrical parameter based method uses the gate-emitter voltage value, Vge being defined for a certain current and for a certain temperature as a inderectly temperature measurement as shown in the next equation:

$$Vge = \partial Vge * Tj + Vge0$$

Where $\partial Vge$ is the Vge variation with temperature and Vge0 is the voltage Vge at 0° C. for a given collector-emitter current.

The temperature sensitive electrical parameter based method requires a calibration phase performed just after the device manufacturing.

In this calibration phase, the power die is heated to the Tcref and an external current source injects a calibration current Ic,cal value, eg. 0.5 A, through the die collector-emitter with the gate-collector terminals short circuited. Then, the voltage value of the gate-emitter is measured and defined as Vgcal. This voltage is further used as a set point to indirectly measure the temperature of the die as shown in above mentioned equation.

During the operation of the restoration process, the measured collector current $I_c$ is subtracted to the reference current $I_{ref}$ by the subtractor 901 in order to obtain a difference current $\partial I_c$. The module 902 is a proportional integrator that transforms the difference current $\partial I_c$ provided by the module 901 in the gate bias voltage CRTLi that can be defined by a proportional ($K_{p2}$) and integral ($K_{i2}$) relationship, assuming that we are operating at the DC gate bias voltage, $V_{bias}$, which is slightly higher than the datasheet threshold voltage.

The voltage CRTLi is provided to the voltage regulator Regi and the gate voltage controller 30 it provides the gate to emiter voltage Vge to the die Di.

In a first moment, the signal 'Ttrigger' is HIGH, the reference current, Iref, is set by the block 900 equal to the pre-defined current, Ic,cal. The steady state voltage Vgref is sampled with a time constant, $t_e$, some 100 μs given by the electric time constant.

During the falling edge of Ttrigger, the gate voltage, Vgref, is sampled and held by a sample and hold circuit 905. The Vgcal value is subtracted from the output value of the sample and hold circuit 905 by a subtractor 906, and the result of the subtractor 906 is provided to a proportional integrator 907, which generates the signal $I_{c,pwr}$. The proportional integrator 907 transforms the difference voltages $\partial Vg$ provided by the subtractor 906 in the current $I_{c,pwr}$ that can be defined by a proportional ($K_{p3}$) and integral ($K_{i3}$) relationship. Again, we need to assume some gain C'' exists based on the sampling frequency, $1/(t_e+t_r)$ is some constant defined by the physical properties of the semiconductor type, and the magnitude of the desired error compensation.

$$Vge = dVge * Tj + Vge0$$
$$Tj = R_{th}*P, P = I_c*V_{ce} \therefore \partial Vge = dVge*R_{th}*V_{ce}*\partial I_c \rightarrow I_{c,pwr} =$$
$$\Delta T*\left(\frac{1}{dVge*R_{th}*V_{ce}}\right) + \left(\frac{C''}{dVge*R_{th}*V_{ce}}\right)\int \Delta T dt \rightarrow I_{c,pwr} =$$
$$\Delta T * K_{p3} + K_{i3}\int \Delta T dt$$

When the signal 'Ttrigger' is low, the reference current, Iref, is set by the block 900 equal to a previous calculated current, Ic,pwr and maintained during the time $t_r$, e.g. some minutes, according to the predefined restoration time.

The invention claimed is:

1. A system for allowing the restoration of an interconnection of a die of a power module, a first terminal of the interconnection being fixed on the die and a second terminal of the interconnection being connected to an electric circuit, the system comprising:
   at least one material located in the vicinity of the first terminal of the interconnection, the material having a predetermined melting temperature, and
   a controller configured to control the temperature of the die at the predetermined melting temperature during a predetermined period of time, wherein
   the die is fixed on a copper layer of a direct copper bonding substrate, and the die, the direct copper bonding substrate and the at least one material located in the vicinity of the first terminal is covered by a solid material.

2. The system according to claim 1, characterized in that the material located in the vicinity of the first terminal is tin and lead-bismuth alloy.

3. The system according to claim 2, characterized in that the melting temperature is equal to 150° C. and the predetermined period of time is 30 minutes.

4. The system according to claim 1, characterized in that the controller obtains the temperature of the die from a thermocouple.

5. The system according to claim 2, characterized in that the controller obtains the temperature of the die from a thermocouple.

6. The system according to claim 3, characterized in that the controller obtains the temperature of the die from a thermocouple.

7. The system according to claim 1, characterized in that the controller obtains the temperature of the die from a temperature sensitive electrical parameter of the die.

8. The system according to claim 2, characterized in that controller obtains the temperature of the die from a temperature sensitive electrical parameter of the die.

9. The system according to claim 3, characterized in that controller obtains the temperature of the die from a temperature sensitive electrical parameter of the die.

10. The system according to claim 7, characterized in that the temperature sensitive electrical parameter of the die is a gate-emitter voltage value of the die.

11. The system according to claim 8, characterized in that the temperature sensitive electrical parameter of the die is a gate-emitter voltage value of the die.

12. The system according to claim 9, characterized in that the temperature sensitive electrical parameter of the die is a gate-emitter voltage value of the die.

13. A method for allowing the restoration of an interconnection of a die of a power module, a first terminal of the interconnection being fixed on the die and a second terminal of the interconnection being connected to an electric circuit, at least one material located in the vicinity of the first terminal of the interconnection having a predetermined melting temperature, the method comprising the step of controlling the temperature of the die at the predetermined melting temperature during a predetermined period of time, wherein the die is fixed on a copper layer of a direct copper bonding substrate, and the die, the direct copper bonding substrate and the at least one material located in the vicinity of the first terminal is covered by a solid material.

\* \* \* \* \*